US008850295B2

(12) United States Patent
Chen et al.

(10) Patent No.: US 8,850,295 B2
(45) Date of Patent: Sep. 30, 2014

(54) SYMBOL FLIPPING DATA PROCESSOR

(75) Inventors: Lei Chen, Santa Clara, CA (US); Haitao Xia, San Jose, CA (US); Ming Jin, Milpitas, CA (US); Johnson Yen, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 317 days.

(21) Appl. No.: 13/363,751

(22) Filed: Feb. 1, 2012

(65) Prior Publication Data
US 2013/0198580 A1 Aug. 1, 2013

(51) Int. Cl.
*H03M 13/00* (2006.01)

(52) U.S. Cl.
USPC .......................................... 714/780; 714/781

(58) Field of Classification Search
CPC ................................................ H03M 13/1108
USPC .......................................... 714/752, 780, 782
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Esaw Abraham
(74) *Attorney, Agent, or Firm* — Hamilton DeSanctis & Cha

(57) ABSTRACT

Various embodiments of the present invention provide systems and methods for a symbol flipping data processor. For example, a symbol flipping data processor is disclosed that includes a data decoder in the symbol flipping data processor operable to perform error checking calculations, and a data detector in the symbol flipping data processor operable to perform symbol flipping in the data detector based at least in part on the error checking calculations, wherein the output of the data processor is generated at least in part based on the symbol flipping in the data detector.

20 Claims, 4 Drawing Sheets

(56) References Cited

U.S. PATENT DOCUMENTS

| | | | |
|---|---|---|---|
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,421,041 | B2 * | 9/2008 | Khandekar et al. ........... 375/316 |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,751,506 | B2 * | 7/2010 | Niu et al. ...................... 375/341 |
| 7,752,523 | B1 | 7/2010 | Chaichanavong |
| 7,760,822 | B1 * | 7/2010 | Burd et al. ..................... 375/341 |
| 7,779,325 | B2 | 8/2010 | Song |
| 7,802,172 | B2 | 9/2010 | Vila Casado et al. |
| 7,865,799 | B2 * | 1/2011 | Sawaguchi ................... 714/755 |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,055,977 | B2 * | 11/2011 | Ito ................................. 714/758 |
| 8,201,051 | B2 | 6/2012 | Tan |
| 8,237,597 | B2 | 8/2012 | Liu |
| 8,261,171 | B2 | 9/2012 | Annampedu |
| 8,291,284 | B2 | 10/2012 | Savin |
| 8,295,001 | B2 | 10/2012 | Liu |
| 8,411,537 | B2 * | 4/2013 | Tan et al. .................... 369/47.14 |
| 8,457,256 | B2 * | 6/2013 | Gamage et al. ............... 375/341 |
| 8,477,862 | B2 * | 7/2013 | Sun et al. ...................... 375/265 |
| 8,510,642 | B2 * | 8/2013 | Risso et al. ................... 714/786 |
| 8,566,676 | B2 * | 10/2013 | Palanki et al. ................ 714/776 |
| 8,572,454 | B1 * | 10/2013 | Yeo et al. ...................... 714/752 |
| 8,595,585 | B2 * | 11/2013 | Djordjevic et al. ........... 714/755 |
| 8,638,885 | B2 * | 1/2014 | Evseev et al. ................ 375/341 |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |
| 2010/0042890 | A1 | 2/2010 | Gunnam et al. |
| 2011/0167227 | A1 | 7/2011 | Yang |
| 2011/0264987 | A1 | 10/2011 | Li |
| 2012/0005551 | A1 | 1/2012 | Gunnam et al. |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kang et al., "A Two-Stage Iterative Decoding of LDPC Codes for Lowering Error Floors", IEEE Globecom Proceedings, 1088-1091 (2008).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"---IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Perisa et al "Frequency Offset Estimation Based on Phase Offsets Between Sample Correlations" Dept. of Info. Tech. University of Ulm 2005.

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsši: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/113,219, Unpublished (filed May 23, 2011) (Yang Han).

U.S. Appl. No. 13/269,852, Unpublished (filed Oct. 10, 2011) (Haitao Xia).

(56) References Cited

OTHER PUBLICATIONS

U.S. Appl. No. 13/316,858, Unpublished (filed Dec. 12, 2011) (Zongwang Li).
U.S. Appl. No. 13/284,754, Unpublished (filed Oct. 28, 2011) (Fan Zhang).
U.S. Appl. No. 13/362,409, Unpublished (filed Jan. 31, 2012) (Fan Zhang).
U.S. Appl. No. 13/316,741, Unpublished (filed Dec. 12, 2011) (Yang Han).
U.S. Appl. No. 13/340,974, Unpublished (filed Dec. 30, 2011) (Dan Liu).
U.S. Appl. No. 13/340,951, Unpublished (filed Dec. 30, 2011) (Lei Chen).
U.S. Appl. No. 13/283,549, Unpublished (filed Oct. 27, 2011) (Wu Chang).
U.S. Appl. No. 13/180,495, Unpublished (filed Jul. 11, 2011) (Chung-Li Wang).
U.S. Appl. No. 13/213,751, Unpublished (filed Aug. 19, 2011) (Fan Zhang).
U.S. Appl. No. 13/186,234, Unpublished (filed Jul. 19, 2011) (Haitao Xia).
U.S. Appl. No. 13/171,615, Unpublished (filed Jun. 29, 2011) (Bradley D. Seago).
U.S. Appl. No. 13/239,683, Unpublished (filed Sep. 22, 2011) (Changyou Xu).
U.S. Appl. No. 13/227,544, Unpublished (filed Sep. 8, 2011) (Shaohua Yang).
U.S. Appl. No. 13/327,279, Unpublished (filed Dec. 15, 2011) (Wei Feng).
U.S. Appl. No. 13/284,767, Unpublished (filed Oct. 28, 2011) (Fan Zhang).
U.S. Appl. No. 13/300,078, Unpublished (filed Nov. 18, 2011) (Chung-Li Wang).
U.S. Appl. No. 13/295,150, Unpublished (filed Nov. 14, 2011) (Zongwang Li).
U.S. Appl. No. 13/284,730, Unpublished (filed Oct. 28, 2011) (Fan Zhang).
U.S. Appl. No. 13/302,119, Unpublished (filed Nov. 22, 2011) (Lei Chen).
U.S. Appl. No. 13/305,510, Unpublished (filed Nov. 28, 2011) (Lei Chen).
U.S. Appl. No. 13/227,416, Unpublished (filed Sep. 7, 2011) (Lei Chen).
U.S. Appl. No. 13/305,551, Unpublished (filed Nov. 28, 2011) (Yang Han).
U.S. Appl. No. 13/296,022, Unpublished (filed Nov. 14, 2011) (Victor Krachkovsky).
U.S. Appl. No. 13/174,537, Unpublished (filed Jun. 30, 2011) (Anantha Raman Krishnan).
U.S. Appl. No. 13/174,453, Unpublished (filed Jun. 30, 2011) (Johnson Yen).
U.S. Appl. No. 13/269,832, Unpublished (filed Oct. 10, 2011) (Haitao Xia).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. In COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

US 8,850,295 B2

SYMBOL FLIPPING DATA PROCESSOR

BACKGROUND

Digital information storage and transmission has become ubiquitous in practically every facet of life throughout most of the world. Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, data detectors and decoders such as Maximum a Posteriori (MAP) detectors and Low Density Parity Check (LDPC) decoder may be used to detect and decode the values of data bits or symbols retrieved from storage or transmission systems.

A need remains for improvements in data detection and decoding to improve accuracy and efficiency.

BRIEF SUMMARY

Various embodiments of the present invention are related to apparatuses and methods for symbol flipping data processors. For example, a symbol flipping data processor is disclosed that includes a data decoder in the symbol flipping data processor operable to perform error checking calculations, and a data detector in the symbol flipping data processor operable to perform symbol flipping in the data detector based at least in part on the error checking calculations, wherein the output of the data processor is generated at least in part based on the symbol flipping in the data detector. In some embodiments, the data detector comprises a symbol-based Maximum a Posteriori detector and the data decoder comprises a multi-level Low Density Parity Check decoder. In some instances of the aforementioned embodiments, the data detector calculates a path value for path between states in a trellis by combining a state value with a branch metric value, and a default surviving path is identified between states may be selected based on the path values, for example by selecting the minimum path value. Symbols may be flipped in the data detector by selecting paths other than the default surviving path. In some embodiments this is accomplished by calculating delta values or normalized path values, for example subtracting the path value for the default surviving path from each of the path values for the remaining paths, and selecting the path with either the smallest delta value, referred to herein as the minimum delta value or the next smallest delta value, referred to herein as the second minimum delta value.

Some embodiments of the present invention provide a method for processing data, including detecting symbol values in a data detector to yield detected data, calculating a number of violated parity checks for the detected data in a data decoder, and flipping symbols in the data detector based on the number of violated parity checks to yield updated detected data. In some embodiments, flipping symbols in the data detector includes calculating a path value for path between a first state and a second state in a trellis by combining a state value and a branch metric value. Flipping symbols in the data detector may also include identifying a default surviving path between the first state and the second state based on the path values, normalizing path values for remaining paths between the first state and the second state, and selecting one of the remaining paths based on a smallest normalized path value and a next smallest normalized path value.

In some embodiments, the method includes comprising calculating a second number of violated parity checks for the updated detected data, and decoding the updated detected data in the data decoder when the second number of violated parity checks does not exceed a first threshold. The method may also include comprising maintaining previously flipped symbols and flipping additional symbols in the data detector when the second number of violated parity checks is between the first threshold and a second threshold. The method may also include restoring previously flipped symbols and flipping additional symbols in the data detector when the second number of violated parity checks exceeds the second threshold.

In some embodiments, the method also includes flipping symbols in the data decoder.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Various embodiments of the present invention are related to apparatuses and methods for symbol flipping data processors. Symbols are flipped in a data processor in an attempt to improve burst error correction capabilities and decoding convergence during data detection and decoding. The symbol flipping may be performed in either or both a data detector and a data decoder in the data processor, such as a MAP detector and LDPC decoder. Symbol flipping is initiated in some embodiments by a symbol error event of the MAP detector, as identified by a parity check in the LDPC decoder downstream from the MAP detector. If the number of parity check violations exceed a threshold or fall within a particular range, a controller in the detector or decoder changes or flips the values of one or more selected symbols and retries detection or decoding iterations.

The term "symbol flipping" is used herein to refer to changing the values of multi-bit symbols in a detector or decoder. In a MAP detector, a symbol is flipped by changing the log-likelihood ratio (LLR) input value, which is used to determine branch metrics which are added to state values to determine the next state value. In a multi-level LDPC decoder, a symbol is flipped by changing the LLR input value to different elements of the Galois Field associated with the LDPC decoder. For example, in a GF(4) decoder, the symbol may be flipped by adding 1, 2 or 3 to the hard decision. The symbol flipping may be performed in any manner suitable to the particular detector and decoder and the format of its input. For example, the input to the LDPC decoder may consist of a hard decision identifying one of the Galois Field elements as the most likely real value along with an LLR value for each of the other Galois Field elements, indicating the likelihood that the real value corresponds to each of the other Galois Field elements.

Figure 1:
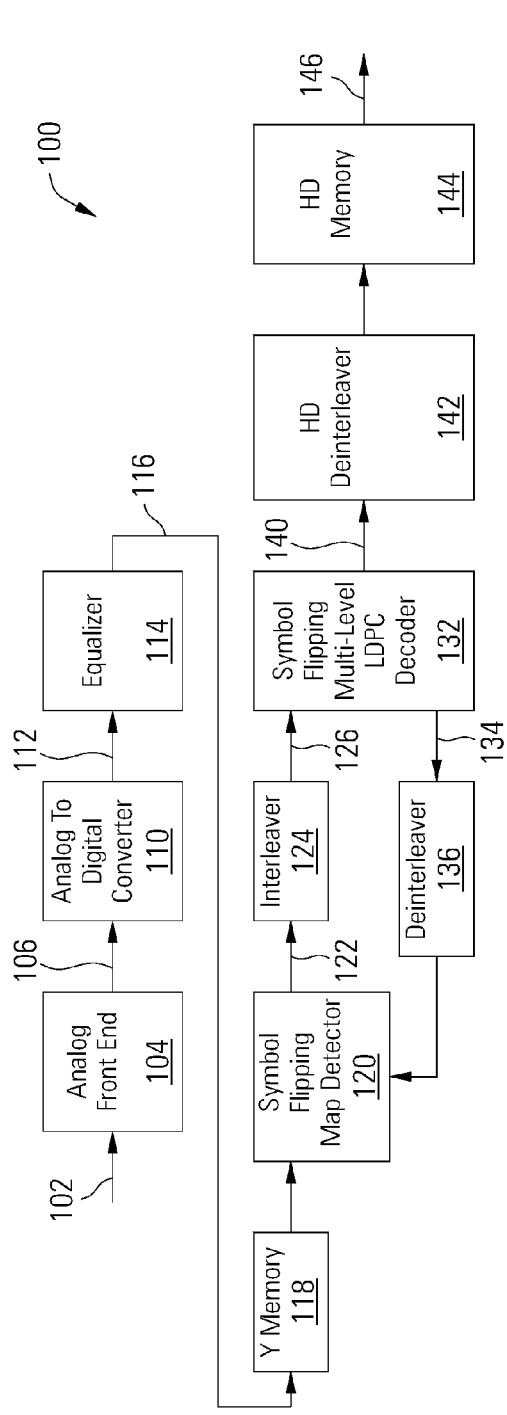
FIG. 1 depicts a block diagram of a read channel with a data processor comprising a detector and decoder which may be used to retrieve or receive stored or transmitted data in accordance with various embodiments of the present invention.

Turning to FIG. 1, a read channel 100 is used to process an analog signal 102 and to retrieve user data bits from the analog signal 102 without errors. In some cases, analog signal 102 is derived from a read/write head assembly in a magnetic storage medium. In other cases, analog signal 102 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 102 may be derived.

The read channel 100 includes an analog front end 104 that receives and processes the analog signal 102. Analog front end 104 may include, but is not limited to, an analog filter and an amplifier circuit as are known in the art. Based upon the disclosure provided herein, one of ordinary skill in the art will recognize a variety of circuitry that may be included as part of analog front end 104. In some cases, the gain of a variable gain amplifier included as part of analog front end 104 may be modifiable, and the cutoff frequency and boost of an analog filter included in analog front end 104 may be modifiable. Analog front end 104 receives and processes the analog signal 102, and provides a processed analog signal 106 to an analog to digital converter 110.

Analog to digital converter 110 converts processed analog signal 106 into a corresponding series of digital samples 112. Analog to digital converter 110 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 112 are provided to an equalizer 114. Equalizer 114 applies an equalization algorithm to digital samples 112 to yield an equalized output 116. In some embodiments of the present invention, equalizer 114 is a digital finite impulse response filter circuit as is known in the art. Data or codewords contained in equalized output 116 may be stored in a buffer 118 until a data detector 120 is available for processing.

The data detector 120 performs a data detection process on the received input, resulting in a detected output 122. In some embodiments of the present invention, data detector 120 is a symbol flipping MAP detector. In these embodiments, the detected output 122 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 120 is started based upon availability of a data set in buffer 118 from equalizer 114 or another source. Data detector 120 yields a detected output 122 that includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art.

The detected output 122 from data detector 120 is provided to an interleaver 124 that protects data against burst errors. Burst errors overwrite localized groups or bunches of bits. Because LDPC decoders are best suited to correcting errors that are more uniformly distributed, burst errors can overwhelm LDPC decoders. The interleaver 124 prevents this by interleaving or shuffling the detected output 122 from data detector 120 to yield an interleaved output 126 which is stored in a memory 130. Interleaver 124 may be any circuit known in the art that is capable of shuffling data sets to yield a rearranged data set. The interleaved output 126 from the memory 130 is provided to a multi-level LDPC decoder 132 which performs parity checks on the interleaved output 126, ensuring that parity constraints established by an LDPC encoder (not shown) before storage or transmission are satisfied in order to detect and correct any errors that may have occurred in the data during storage or transmission or during processing by other components of the read channel 100.

The term "data processor" is used herein to refer to either or both the data detector 120 and the LDPC decoder 132.

Multiple detection and decoding iterations may be performed in the read channel 100, referred to herein as global iterations. (In contrast, local iterations are decoding iterations performed within the multi-level LDPC decoder 132.) To perform a global iteration, LLR values 134 from the multi-level LDPC decoder 132 are stored in memory 130, deinterleaved in a deinterleaver 136 to reverse the process applied by interleaver 124, and provided again to the data detector 120 to allow the data detector 120 to repeat the data detection process, aided by the LLR values 134 from the multi-level LDPC decoder 132. In this manner, the read channel 100 can perform multiple global iterations, allowing the data detector 120 and multi-level LDPC decoder 132 to converge on the correct data values.

The multi-level LDPC decoder 132 also produces hard decisions 140 about the values of the data bits or symbols contained in the interleaved output 126 of the interleaver 124. For binary data bits, the hard decisions may be represented as 0's and 1's. For multi-level symbols, in a GF(4) LDPC decoder, the hard decisions may be represented by field elements 00, 01, 10 and 11.

The hard decisions 140 from multi-level LDPC decoder 132 are deinterleaved in a hard decision deinterleaver 142, reversing the process applied in interleaver 124, and stored in a hard decision memory 144 before being provided to a user or further processed. For example, the output 146 of the read channel 100 may be further processed to reverse formatting changes applied before storing data in a magnetic storage medium or transmitting the data across a transmission channel.

By performing symbol-based detection in the data detector 120 with symbol flipping in the data detector 120 as well as the LDPC decoder 132, the error performance and the signal to noise ratio (SNR) gain of the entire read channel 100 is improved.

Figure 2:
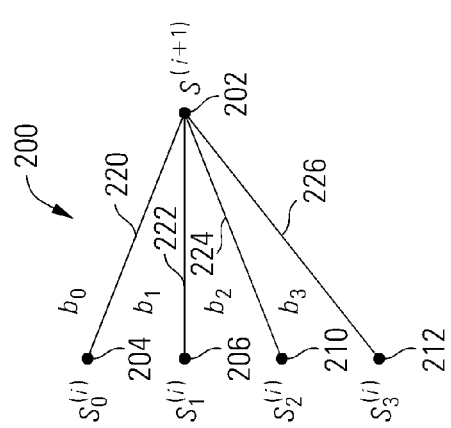
FIG. 2 depicts a portion of a trellis in a detector in accordance with various embodiments of the present invention.

Turning to FIG. 2, a portion of a trellis 200 in the data detector 120 is illustrated, showing the branches between a state $S^{(i+1)}$ 202 at time i+1 and four states $S_0^{(i)}$ 204, $S_1^{(i)}$ 206, $S_2^{(i)}$ 210, and $S_3^{(i)}$ 212 at time i. Each state 202-212 represents the value of a symbol. In embodiments with two bit symbols, each state 202-212 gives the LLR value indicating that the symbol for that time period has the value 00, 01, 10 or 11 corresponding with each state. In some embodiments, the data detector 120 begins with the last symbol of a block of data and works backward, detecting the value of the symbol at each time period (e.g., i) based upon the value of the symbol at the next time period (e.g., i+1) and the branch metric values $b_0$, $b_1$, $b_2$ and $b_3$ for the branches (e.g., 220, 222, 224, 226) between symbols. The data detector 120 thus may operate in reverse order from a data encoder (not shown). The branch metric values $b_0$, $b_1$, $b_2$ and $b_3$ are generated based on the LLR values for each symbol as it is provided to the data detector 120.

In some embodiments, the surviving path or branch (e.g., 220, 222, 224, 226) between states may be calculated as the minimum of each state LLR plus its corresponding branch metric value according to Equation 1:

$$S^{(i+1)}=\min(S_0^{(i)}+b_0, S_1^{(i)}+b_1, S_2^{(i)}+b_2, S_3^{(i)}+b_3) \quad (Eq\ 1)$$

where $S^{(i+1)}$ represents the minimum value and surviving path. The combination of a state value and an associated branch metric (e.g., $S_0^{(i)}+b_0$) is referred to herein as a path value.

During normal operation, the default surviving path $S^{(i+1)}$ would be selected as the surviving path between time i+1 and time i. In the example above, $S_3^{(i)}$ is the surviving path.

However, if symbol flipping is triggered for any reason in the read channel 100, for example if the number of parity check violations in the LDPC decoder 132 exceeds a threshold number of unsatisfied checks $USC_1$, then other paths are selected as the surviving path, effectively flipping the value of the symbol. These other paths or remaining paths are selected based on delta ($\Delta$) values. (Symbol flipping may be triggered in any suitable manner, for example using other error checking functions in the LDPC decoder 132 or in other devices.)

Delta values are calculated for all paths other than the default surviving path $S^{(i+1)}$ between times i+1 and i. For example, assume that the fourth branch $b_3$ 226 is the surviving path according to Equation 2:

$$S^{(i+1)}=\min(S_0^{(i)}+b_0, S_1^{(i)}+b_1, S_2^{(i)}+b_2, S_3^{(i)}+b_3)=S_3^{(i)}+b_3 \quad (Eq\ 2)$$

Given this assumption, and a two bit symbol, the three delta values are calculated by normalizing the remaining paths to the default surviving path as follows:

$$\Delta_1=(S_0^{(i)}+b_0)-(S_3^{(i)}+b_3) \quad (Eq\ 3)$$

$$\Delta_1=(S_1^{(i)}+b_1)-(S_3^{(i)}+b_3) \quad (Eq\ 4)$$

$$\Delta_1=(S_2^{(i)}+b_2)-(S_3^{(i)}+b_3) \quad (Eq\ 5)$$

The smallest $\Delta_s$ and second smallest $\Delta'_s$ are calculated as follows:

$$\Delta_s=\min(\Delta_1, \Delta_2, \Delta_3) \quad (Eq\ 6)$$

$$\Delta'_s=\text{second min}(\Delta_1, \Delta_2, \Delta_3) \quad (Eq\ 7)$$

In some embodiments, symbols are flipped in the data detector 120 based on the paths with the smallest $\Delta_s$ and second smallest $\Delta'_s$ as follows. When symbol flipping is triggered in the read channel 100, for example when the number of parity check violations in the LDPC decoder 132 exceeds a threshold $USC_1$, then the path with the smallest $\Delta_s$ or second smallest $\Delta'_s$ is selected instead of $S^{(i+1)}$, flipping the symbol for time i. The parity check equations are calculated in the LDPC decoder 132, returning the number of parity check violations. This may be accomplished, for example, by setting the number of local decoding iterations to 0 and running the LDPC decoder 132 to perform parity check calculations without decoding. If the number of parity check violations is below the threshold $USC_1$, then the symbols are kept as flipped and decoding may begin in LDPC decoder 132. If the number of parity check violations is between the lower threshold $USC_1$ and an upper threshold $USC_2$, the symbols are kept as flipped and additional symbols from other time periods are flipped by selecting the smallest $\Delta_s$ or second smallest $\Delta'_s$ for paths for those time periods. Otherwise, if the number of parity check violations is greater than $USC_2$, the flipped symbols are restored and other values are tried, either moving from the smallest $\Delta_s$ to the second smallest $\Delta'_s$ for the restored flipped symbols or by flipping other symbols for other time periods.

Thus, a single symbol value may be flipped in the data detector 120 or multiple symbols for different time periods in a stream of symbols may be flipped. The number of parity check violations may be used as the criterion to flip symbols before decoding, reducing latency and power consumption. The threshold values $USC_1$ and $USC_2$ may be programmed to adjust the symbol flipping behavior of the system.

Figure 3:
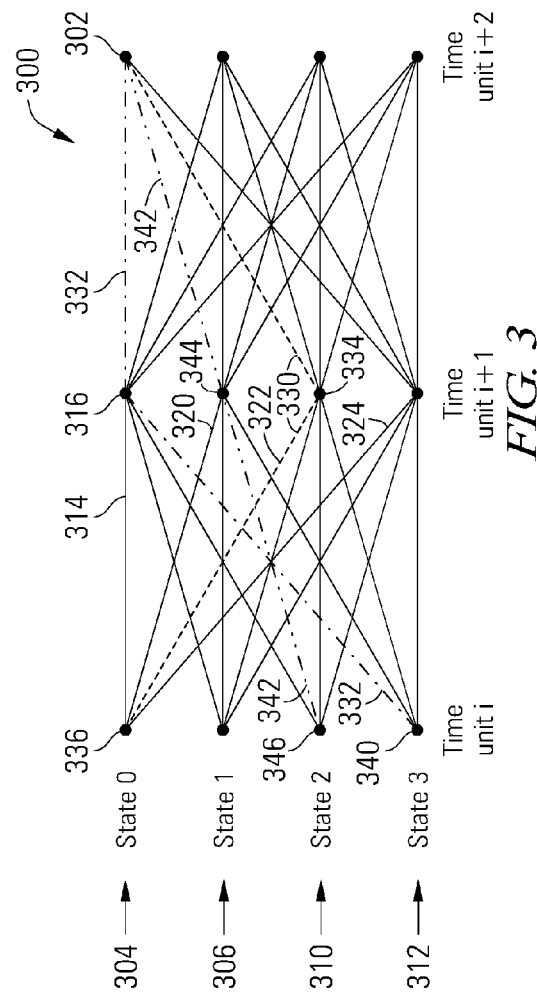
FIG. 3 depicts an example of symbol flipping in a portion of a detector trellis in accordance with various embodiments of the present invention.

Turning to FIG. 3, an example is depicted of symbol flipping in a portion of a detector trellis 300 in accordance with various embodiments of the present invention. As with the examples above, the trellis 300 has four branches entering and leaving each state, corresponding with a 2-bit symbol-based MAP detector. Each dot represents a 2-bit symbol state (e.g., 302), with the top row 304 corresponding to state 0, or the LLR that the symbol for a particular time unit has value 00, the next row 306 corresponding to state 1, or the LLR that the symbol for a particular time unit has value 01, row 310 corresponding to state 2, or the LLR that the symbol for a particular time unit has value 10, and row 312 corresponding to state 2, or the LLR that the symbol for a particular time unit has value 11. The path or branch between each state represents a symbol input value 00, 01, 10 or 11, depending on the destination state, and has a branch metric specifying the likelihood that the particular path is the correct path in the trellis 300. For example, path 314 ends at a state 0 316 in row 304 at time i+1, and therefore represents input symbol 00. Similarly, path 320 represents input symbol 01, path 322 represents input symbol 10, and path 324 represents input symbol 11.

Beginning with state 302 at time i+2, assume that path 330 (indicated by a first dashed line) is the original surviving path as determined by Equation 1 when the block of data (e.g., a sector of data) is processed in the data detector 120. The parity checks are calculated in the LDPC decoder 132, and if the number of parity check violations is less than a threshold $USC_1$, decoding is initiated in LDPC decoder 132. If the number of parity check violations is greater than threshold $USC_1$, path 332 (indicated by a second dashed line) with the smallest $\Delta_s$ is selected as the surviving path, flipping the corresponding symbols from those for states 334 and 336 to those for states 316 and 340. The entire data block may be reprocessed in the data detector 120, or just portions of the data block including the flipped symbols. The parity checks are again calculated in the LDPC decoder 132, and if the number of parity check violations is less than a threshold $USC_1$, then this path 332 is maintained as the final surviving path and deciding is initiated in the LDPC decoder 132. If the number of parity check violations is between $USC_1$ and $USC_2$, path 332 is maintained as the surviving path and the data detector 120 continues flipping other symbols. Otherwise, if the number of parity check violations is greater than $USC_2$, the flipped symbols are restored and the path 342 with the second smallest $\Delta'_s$ is selected as the surviving path, flipping the corresponding symbols to those for states 344 and 346. The parity checks are again calculated in the LDPC decoder 132, and if the number of parity check violations is still greater than $USC_2$, the flipped symbols are restored and symbols for other time units are flipped using the same criterion in an effort to reduce the number of parity check violations.

The symbols to be flipped in the data detector 120 may be selected based on which parity checks fail in the LDPC decoder 132, for example by flipping symbols involved in the failing parity checks, or using other techniques, including sequentially moving through the data block or randomly or in any other manner.

The symbol flipping may be performed in the data detector 120 and LDPC decoder 132 by any suitable hardware, software, firmware or combination thereof. For example, the same control system in the data detector 120 that performs branch metric computations and selects surviving paths in the trellis may be adapted to perform the symbol flipping by selecting smallest delta or second smallest delta paths.

Figure 4:
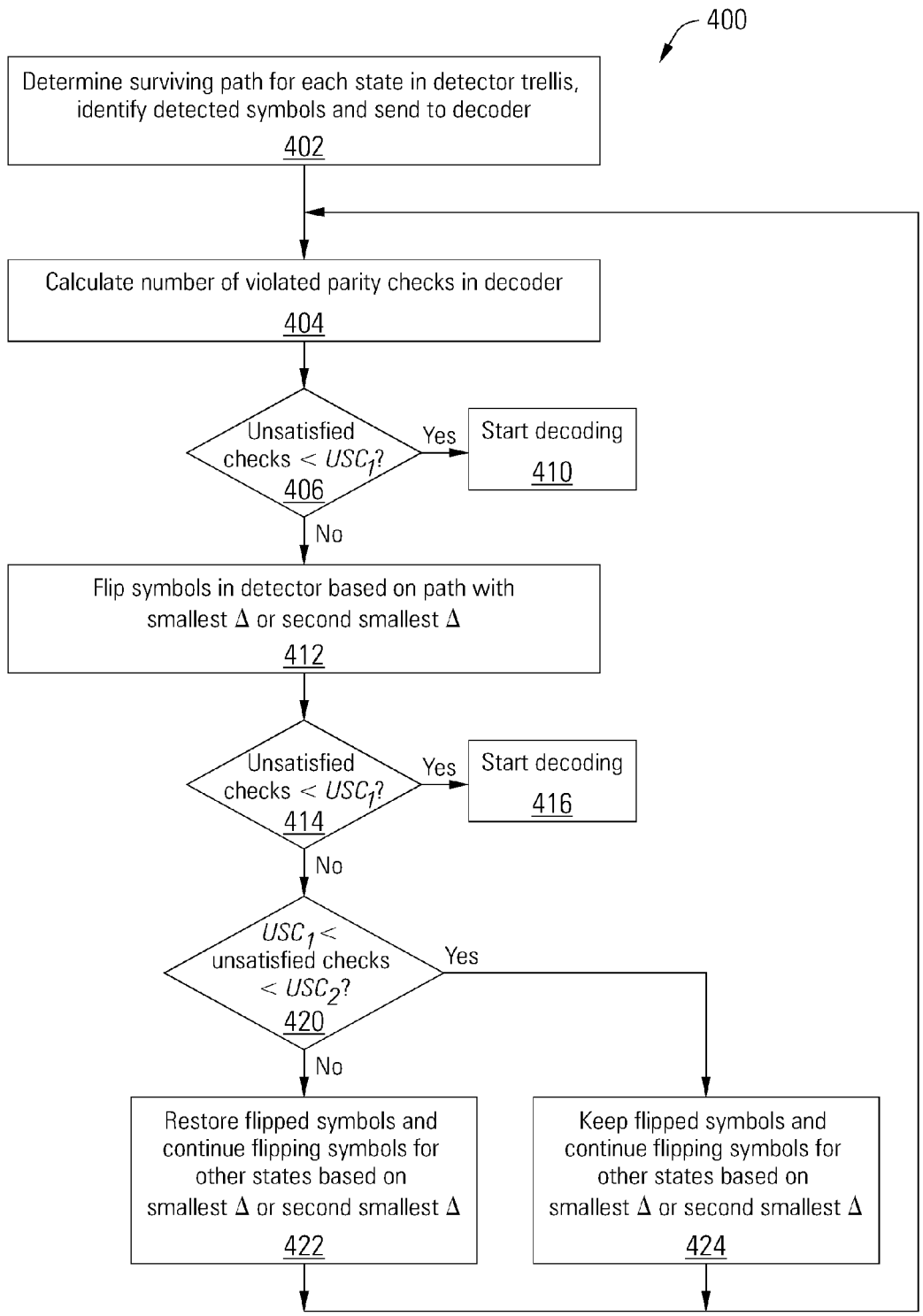
FIG. 4 depicts a flow diagram 400 showing a method for symbol flipping in a data detector in accordance with various embodiments of the present invention.

Turning to FIG. 4, a flow diagram 400 depicts a method for symbol flipping in a data detector in accordance with various embodiments of the present invention. Following flow diagram 400, the surviving path for each state in the trellis is determined, the detected symbols are identified and provided to the decoder. (Block 402) The number of violated parity checks are calculated in the decoder. (Block 404) A determination is made as to whether the number of violated parity checks is less than a threshold $USC_1$. (Block 406) If so, decoding is initiated in the decoder. (Block 410) Otherwise, symbols are flipped in the detector based on the path with the smallest $\Delta_s$ and second smallest $\Delta'_s$. (Block 412) The detector may reprocess the entire data block or a portion of the data block including the flipped symbols. The detected symbols are provided to the decoder, and a determination is again made as to whether the number of violated parity checks is less than a threshold $USC_1$. (Block 414) If so, decoding is initiated in the decoder. (Block 416) Otherwise, a determination is made as to whether the number of violated parity checks is between lower threshold $USC_1$ and upper threshold $USC_2$. (Block 420) If not, the flipped symbols that yielded these results are restored and symbol flipping continues for symbols at other time units, using the same criterion of paths with the smallest $\Delta_s$ and second smallest $\Delta'_s$. (Block 422) If the number of violated parity checks is between lower threshold $USC_1$ and upper threshold $USC_2$, the symbols are kept as flipped and symbol flipping continues for symbols at other time units, using the same criterion of paths with the smallest $\Delta_s$ and second smallest $\Delta'_s$. (Block 424)

In some embodiments, symbol flipping is performed in the LDPC decoder 132 in conjunction with the symbol flipping in the data detector 120. For example, the initial number of violated parity checks $T_1$ may be calculated in the LDPC decoder 132, and if $T_1$ exceeds a programmable threshold, single or multiple symbols are flipped in the LDPC decoder 132, followed by again calculating the updated number of violated parity checks $T_2$. If $T_2$ is 0, decoding is assumed to be successful and is completed. Otherwise, if the difference between $T_1$ and $T_2$ is less than a programmable threshold $T_D$, the flipped symbols is maintained and additional symbols may be flipped to further reduce the number of violated parity checks. Otherwise, the original symbols may be restored and other symbols flipped in the LDPC decoder 132. Symbol flipping in the LDPC decoder 132 may be performed in conjunction with symbol flipping in the data detector 120 in any manner. In some embodiments, symbol flipping in the LDPC decoder 132 is performed as disclosed in U.S. patent application Ser. No. 13/274,443 filed Oct. 17, 2011 for a "LDPC Decoder With Targeted Symbol Flipping", which is incorporated herein for all purposes.

Figure 5:
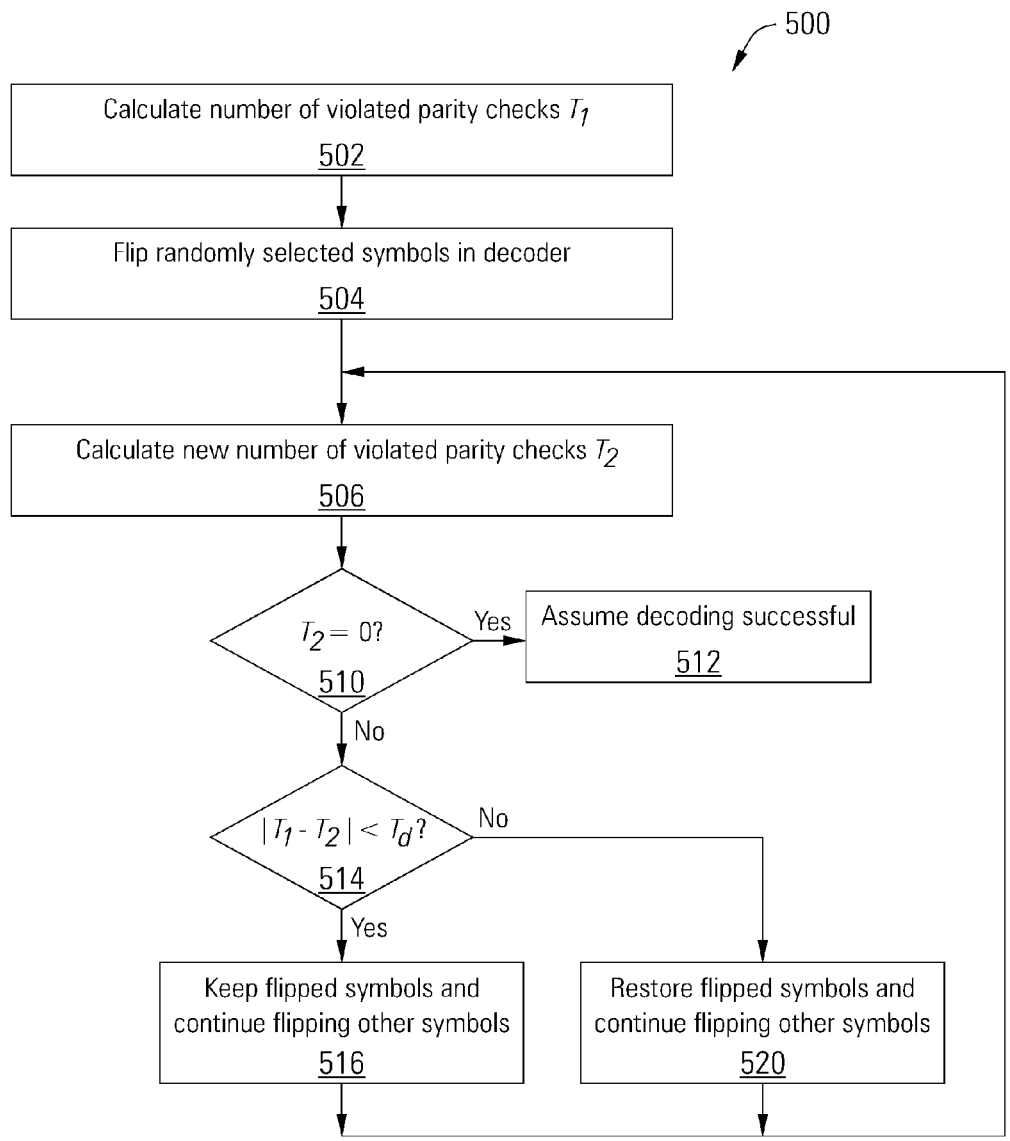
FIG. 5 depicts a flow diagram 400 showing a method for symbol flipping in a data decoder in conjunction with symbol flipping in a data detector in accordance with various embodiments of the present invention.

Turning to FIG. 5, a flow diagram 500 depicts a method for symbol flipping in a data decoder that may be performed in conjunction with symbol flipping in a data detector in accordance with various embodiments of the present invention. For example, symbol flipping may be performed in a MAP detector and in a multi-level LDPC decoder during global iterations in a read channel. Following flow diagram 500, the number of number $T_1$ of violated parity checks are calculated in the decoder based on the input from the detector. (Block 502) If the number $T_1$ is greater than zero, symbol flipping is performed in the decoder by flipping randomly selected symbols. (Block 504) The new number $T_2$ of violated parity checks are calculated in the decoder based on the data in the decoder which includes flipped symbols. (Block 506) A determination is made as to whether the number $T_2$ of violated parity checks is 0. (Block 510) If so, decoding is assumed to be successful and is finished. (Other error checking techniques may also be performed in some embodiments to determine if errors exist that are not detected by the parity check calculations.) If the number $T_2$ of violated parity checks is greater than 0, a determination is made as to whether the difference between the initial number $T_1$ of violated parity checks and the new number $T_2$ of violated parity checks is less than a threshold $T_d$. (Block 514) If so, the symbols are kept as flipped, and symbol flipping continues for other symbols in the data block. (Block 516) Otherwise, the flipped symbols are restored and symbol flipping continues for other symbols in the data block. (Block 520)

Figure 6:
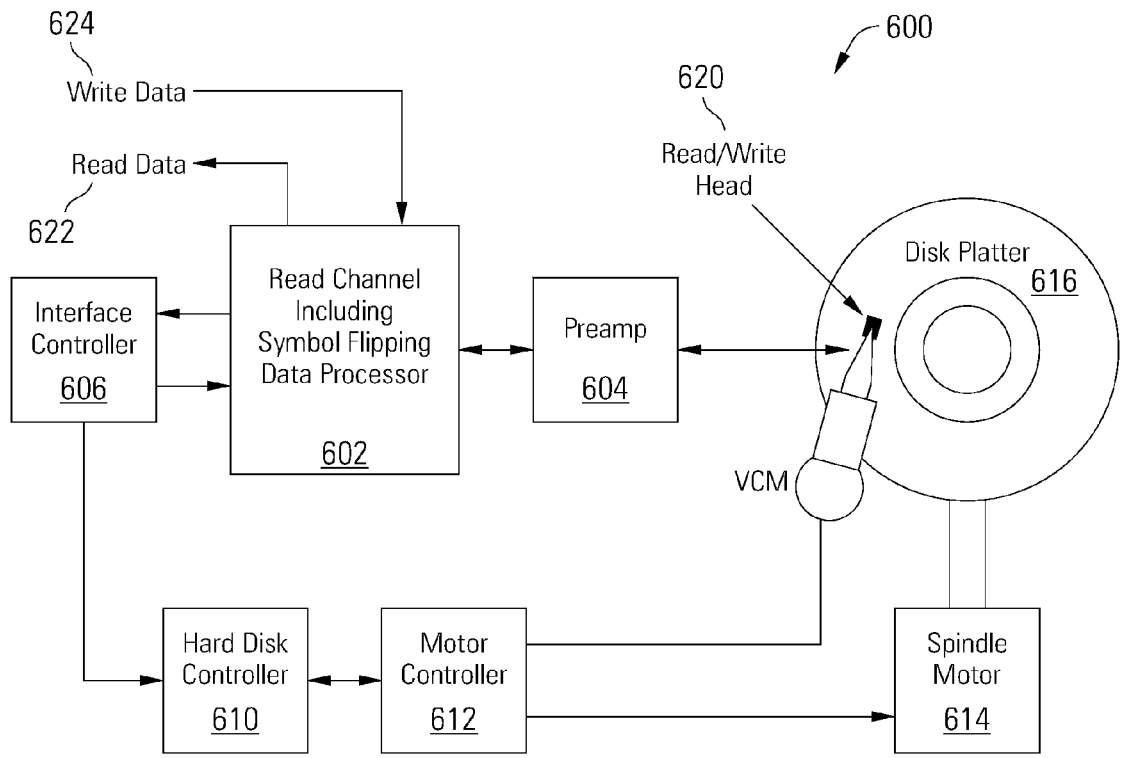
FIG. 6 depicts a storage system including a symbol flipping data processor in accordance with various embodiments of the present invention.
Figure 7:
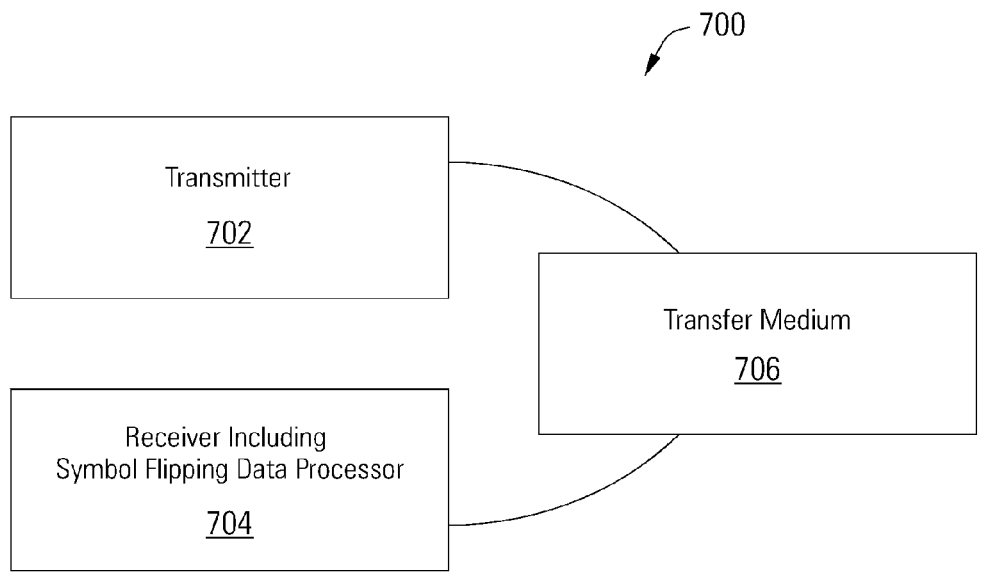
FIG. 7 depicts a wireless communication system including a symbol flipping data processor in accordance with various embodiments of the present invention.

Although the symbol flipping data processor disclosed herein is not limited to any particular application, several examples of applications are presented in FIGS. 6 and 7 that benefit from embodiments of the present invention. Turning to FIG. 6, a storage system 600 is illustrated as an example application of a symbol flipping data processor in accordance with some embodiments of the present invention. The storage system 600 includes a read channel circuit 602 with a symbol flipping data processor in accordance with some embodiments of the present invention. Storage system 600 may be, for example, a hard disk drive. Storage system 600 also includes a preamplifier 604, an interface controller 606, a hard disk controller 610, a motor controller 612, a spindle motor 614, a disk platter 616, and a read/write head assembly 620. Interface controller 606 controls addressing and timing of data to/from disk platter 616. The data on disk platter 616 consists of groups of magnetic signals that may be detected by read/write head assembly 620 when the assembly is properly positioned over disk platter 616. In one embodiment, disk platter 616 includes magnetic signals recorded in accordance with either a longitudinal or a perpendicular recording scheme.

In a typical read operation, read/write head assembly 620 is accurately positioned by motor controller 612 over a desired data track on disk platter 616. Motor controller 612 both positions read/write head assembly 620 in relation to disk platter 616 and drives spindle motor 614 by moving read/write head assembly 620 to the proper data track on disk platter 616 under the direction of hard disk controller 610. Spindle motor 614 spins disk platter 616 at a determined spin rate (RPMs). Once read/write head assembly 620 is positioned adjacent the proper data track, magnetic signals representing data on disk platter 616 are sensed by read/write head assembly 620 as disk platter 616 is rotated by spindle motor 614. The sensed magnetic signals are provided as a continuous, minute analog signal representative of the magnetic data on disk platter 616. This minute analog signal is transferred from read/write head assembly 620 to read channel circuit 602 via preamplifier 604. Preamplifier 604 is operable to amplify the minute analog signals accessed from disk platter 616. In turn, read channel circuit 602 decodes and digitizes the received analog signal to recreate the information originally written to disk platter 616. This data is provided as read data 622 to a receiving circuit. As part of decoding the received information, read channel circuit 602 processes the received signal using a symbol flipping data processor. Such a symbol flipping data processor may be implemented consistent with that disclosed above in relation to FIGS. 1-3. In some cases, the symbol flipping may be performed consistent with the flow diagrams disclosed above in relation to FIGS. 4-5. A write operation is substantially the opposite of the preceding read operation with write data 624 being provided to read channel circuit 602. This data is then encoded and written to disk platter 616.

It should be noted that storage system 600 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 600, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 7, a wireless communication system 700 or data transmission device including a receiver 704 with a symbol flipping data processor is shown in accordance with some embodiments of the present invention. Communication system 700 includes a transmitter 702 that is operable to transmit encoded information via a transfer medium 706 as is known in the art. The encoded data is received from transfer medium 706 by receiver 704. Receiver 704 incorporates a symbol flipping data processor. Such a symbol flipping data processor may be implemented consistent with that described above in relation to FIGS. 1-3. In some cases, the symbol flipping may be done consistent with the flow diagrams discussed above in relation to FIGS. 4-5.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for a symbol flipping data processor. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A symbol flipping data processor comprising:
    a data decoder in the symbol flipping data processor operable to perform error checking calculations; and
    a data detector in the symbol flipping data processor operable to perform symbol flipping in the data detector based at least in part on the error checking calculations, wherein an output of the data processor is generated at least in part based on the symbol flipping in the data detector, and wherein at least one symbol to be flipped in the data detector is selected based on which parity checks failed in the data decoder.

2. The symbol flipping data processor of claim 1, wherein the data detector is operable to calculate a path value for each of a plurality of paths in a trellis by combining a state value associated with each of the plurality of paths with a corresponding branch metric value.

3. The symbol flipping data processor of claim 2, wherein the data detector is further operable to identify a default surviving path between states in the trellis.

4. The symbol flipping data processor of claim 3, wherein the data detector is further operable to calculate a delta value for each of a plurality of remaining paths between the states in the trellis by subtracting the path value for the default surviving path from the path value for the particular one of the plurality of remaining paths.

5. The symbol flipping data processor of claim 4, wherein the symbol flipping in the data detector comprises selecting the path corresponding to a smallest of the delta values between the states in the trellis.

6. The symbol flipping data processor of claim 5, wherein the symbol flipping in the data detector further comprises selecting the path corresponding to a next smallest of the delta values between the states in the trellis.

7. The symbol flipping data processor of claim 1, wherein the data decoder is operable to perform symbol flipping of symbols in the data decoder.

8. The symbol flipping data processor of claim 1, wherein the data detector comprises a symbol-based Maximum a Posteriori detector and the data decoder comprises a multi-level Low Density Parity Check decoder.

9. The symbol flipping data processor of claim 1, wherein the data detector and the data decoder are implemented as an integrated circuit.

10. The symbol flipping data processor of claim 1, wherein the data detector and the data decoder are incorporated in a storage device.

11. The symbol flipping data processor of claim 1, wherein the data detector and the data decoder are incorporated in a storage system comprising a redundant array of independent disks.

12. The symbol flipping data processor of claim 1, wherein the data detector and the data decoder are incorporated in a transmission system.

13. A method for processing data, comprising:
   detecting symbol values in a data detector to yield detected data;
   calculating a number of violated parity checks for the detected data in a data decoder; and
   flipping selected symbols in the data detector based on the number and identity of violated parity checks to yield updated detected data.

14. The method of claim 13, further comprising flipping symbols in the data decoder.

15. The method of claim 13, wherein flipping symbols in the data detector comprises calculating a path value for each of a plurality of paths between a first state and a second state in a trellis, wherein the path values are calculated by combining a state value and a branch metric value corresponding with the associated one of the plurality of paths.

16. The method of claim 15, wherein flipping symbols in the data detector further comprises identifying a default surviving path between the first state and the second state based on the path values, normalizing path values for remaining paths between the first state and the second state, and selecting one of the remaining paths based on a smallest normalized path value and a next smallest normalized path value.

17. The method of claim 16, further comprising calculating a second number of violated parity checks for the updated detected data, and decoding the updated detected data in the data decoder when the second number of violated parity checks does not exceed a first threshold.

18. The method of claim 17, further comprising maintaining previously flipped symbols and flipping additional symbols in the data detector when the second number of violated parity checks is between the first threshold and a second threshold.

19. The method of claim 18, further comprising restoring previously flipped symbols and flipping additional symbols in the data detector when the second number of violated parity checks exceeds the second threshold.

20. A storage system comprising:
   a storage medium maintaining a data set;
   a read/write head assembly operable to sense the data set on the storage medium and to provide an analog output corresponding to the data set;
   an analog to digital converter operable to sample a continuous signal to yield a digital output; and
   a symbol flipping data processor comprising:
   a data decoder in the symbol flipping data processor operable to perform error checking calculations; and
   a data detector in the symbol flipping data processor operable to perform symbol flipping in the data detector based at least in part on the error checking calculations, wherein an output of the data processor is generated at least in part based on the symbol flipping in the data detector, and wherein at least one symbol to be flipped in the data detector is selected based on parity checks that failed in the data decoder.

\* \* \* \* \*